United States Patent
Yun et al.

(10) Patent No.: US 12,317,529 B2
(45) Date of Patent: May 27, 2025

(54) SEMICONDUCTOR DEVICE

(71) Applicant: TAIWAN SEMICONDUCTOR MANUFACTURING CO., LTD., Hsinchu (TW)

(72) Inventors: Wei-Sheng Yun, Taipei (TW); Shao-Ming Yu, Hsinchu County (TW); Tung-Ying Lee, Hsinchu (TW); Chih-Chieh Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/194,886

(22) Filed: Apr. 3, 2023

(65) Prior Publication Data
US 2023/0238451 A1    Jul. 27, 2023

Related U.S. Application Data

(63) Continuation of application No. 17/065,235, filed on Oct. 7, 2020, now Pat. No. 11,621,344, which is a continuation of application No. 15/631,012, filed on Jun. 23, 2017, now Pat. No. 10,804,375.

(60) Provisional application No. 62/475,316, filed on Mar. 23, 2017.

(51) Int. Cl.
| | |
|---|---|
| H10D 62/10 | (2025.01) |
| H10D 30/01 | (2025.01) |
| H10D 30/63 | (2025.01) |
| H10D 62/13 | (2025.01) |
| H10D 30/67 | (2025.01) |

(52) U.S. Cl.
CPC ......... *H10D 30/025* (2025.01); *H10D 30/026* (2025.01); *H10D 30/63* (2025.01); *H10D 62/151* (2025.01); *H10D 30/6728* (2025.01); *H10D 62/116* (2025.01)

(58) Field of Classification Search
CPC ............. H01L 29/0653; H01L 29/0847; H01L 29/66666; H01L 29/66787; H01L 29/7827; H01L 29/78642; H10D 30/025; H10D 30/026; H10D 30/63; H10D 30/6728; H10D 62/116; H10D 62/151
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Meiya Li
(74) *Attorney, Agent, or Firm* — Birch, Stewart, Kolasch & Birch, LLP

(57) ABSTRACT

A device includes a plurality of semiconductor fins extending from a substrate. A plurality of first source/drain regions are epitaxially grown from first regions of the semiconductor fins. Adjacent two of the plurality of first source/drain regions grown from adjacent two of the plurality of semiconductor fins are spaced apart by an isolation dielectric. A gate structure laterally surrounds second regions of the plurality of semiconductor fins above the first regions of the plurality of semiconductor fins. A plurality of second source/drain regions are over third regions of the plurality of semiconductor fins above the second regions of the plurality of semiconductor fins.

20 Claims, 21 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,640,636 B1 | 5/2017 | Bentley et al. |
| 9,741,716 B1 | 8/2017 | Cheng et al. |
| 9,773,901 B1 | 9/2017 | Gluschenkov et al. |
| 2012/0299099 A1 | 11/2012 | Huang et al. |
| 2017/0186775 A1 | 6/2017 | Balakrishnan et al. |
| 2017/0309647 A1* | 10/2017 | Basker .............. H01L 21/02538 |
| 2018/0006024 A1* | 1/2018 | Anderson ......... H01L 29/66666 |
| 2018/0248039 A1 | 8/2018 | Hafez et al. |
| 2018/0248046 A1 | 8/2018 | Wu et al. |
| 2018/0277442 A1* | 9/2018 | Leobandung ..... H01L 29/66666 |

* cited by examiner

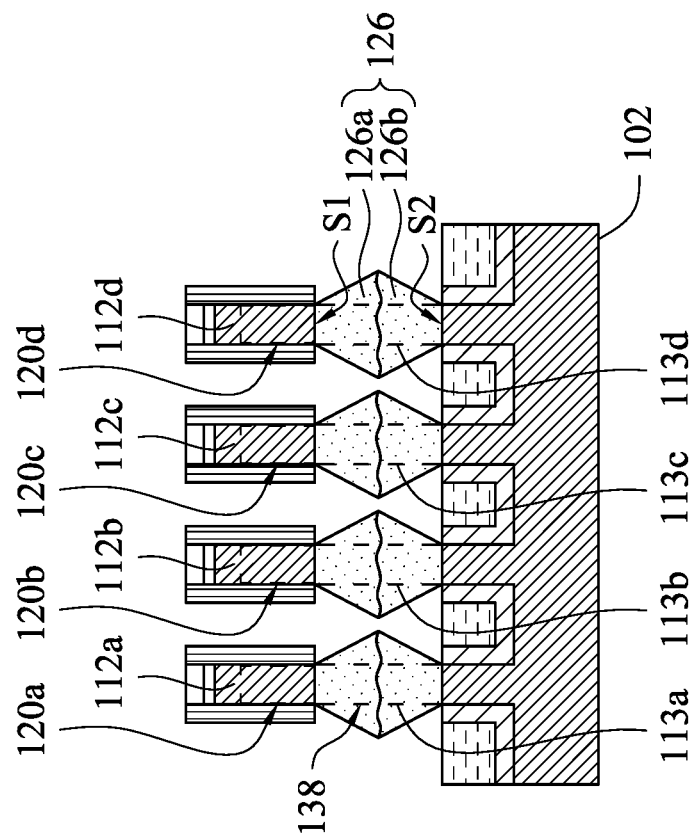
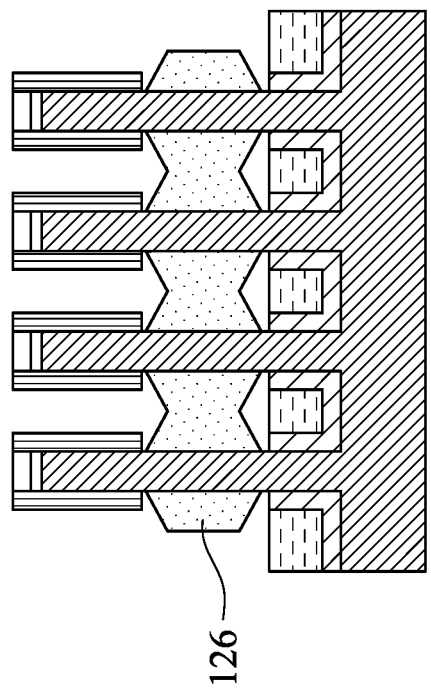
Fig. 25
Fig. 24

SEMICONDUCTOR DEVICE

RELATED APPLICATIONS

This application is a Continuation Application of U.S. application Ser. No. 17/065,235, filed Oct. 7, 2020, now U.S. Pat. No. 11,621,344, issued on Apr. 4, 2023, which is a Continuation Application of U.S. application Ser. No. 15/631,012, filed Jun. 23, 2017, now U.S. Pat. No. 10,804,375, issued on Oct. 13, 2020, which claims priority to U.S. provisional application No. 62/475,316, filed on Mar. 23, 2017, all of which are herein incorporated by reference in their entireties.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20-25 are cross-sectional views of semiconductor devices during fabrication in accordance with some embodiments of the present disclosure.

DETAILED DESCRIPTION

Figure 1:
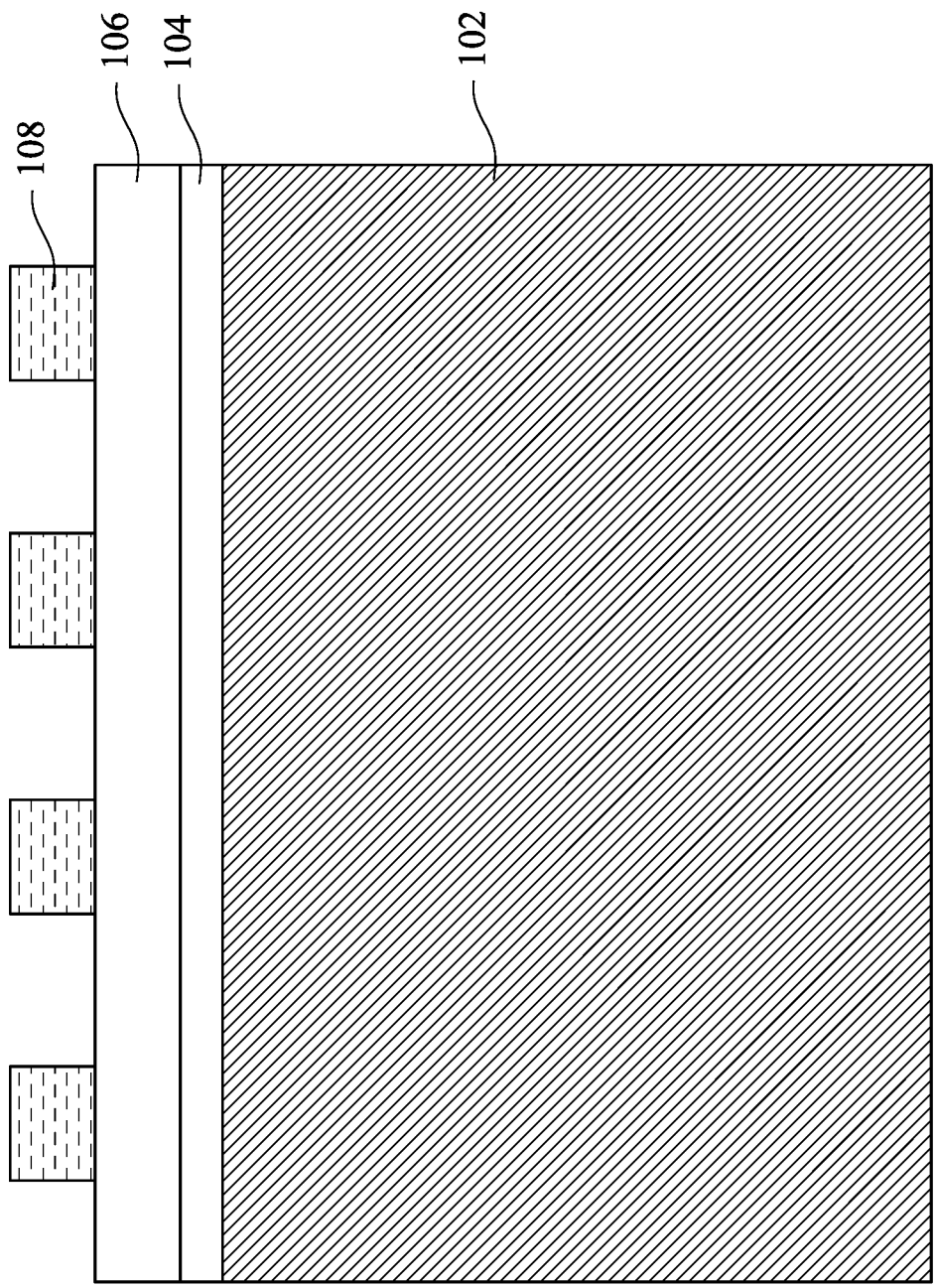
FIGS. 1-19 are cross-sectional views illustrating a semiconductor device at various stages during fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-19 are cross-sectional views illustrating a semiconductor device at various stages during fabrication in accordance with some embodiments of the present disclosure. The semiconductor device includes any fin-based, multi-gate transistor. The semiconductor device may be included in a microprocessor, memory cell, and/or other integrated circuit device. FIGS. 1-18 have been simplified for the sake of clarity to better understand the inventive concepts of the present disclosure. Additional features can be added in the semiconductor device, and some of the features described below can be replaced or eliminated in other embodiments of the semiconductor device.

As shown in FIG. 1, a pad layer 104, a mask layer 106, and a patterned photoresist layer 108 are formed in sequence over a substrate 102. In some embodiments, the substrate 102 is a bulk silicon substrate, such as a silicon wafer. In some embodiments, the substrate 102 includes an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In some embodiments, the substrate 102 includes a silicon-on-insulator (SOI) substrate. The SOI substrate is fabricated using separation by implantation of oxygen (SIMOX), wafer bonding, and/or other suitable methods. In some embodiments, the substrate 102 includes various doped regions and other suitable features.

The pad layer 104 is formed over the substrate 102 and in contact with the substrate 102, in which the pad layer 104 is formed by any suitable process to any suitable thickness. In some embodiments, the pad layer 104 includes silicon oxide and is formed by a chemical vapor deposition (CVD) or a thermal oxidation process, in which the thermal oxidation process is a dry or a wet process. In some embodiments, the silicon oxide can be formed by physical vapor deposition (PVD), atomic layer deposition (ALD), high density plasma CVD (HDPCVD), other suitable methods, and/or combinations thereof.

The mask layer 106 is formed over the pad layer 104 and in contact with the pad layer 104, in which the mask layer 106 serves as a hard mask. The mask layer 106 is formed by any suitable process to any suitable thickness. The mask layer 106 may include a material such as silicon nitride, silicon oxide, silicon oxynitride, silicon carbide, silicon carbon nitride, amorphous silicon, poly silicon, other suitable material, or combinations thereof. In some embodiments, the mask layer 106 includes silicon nitride and is formed by a CVD process. In some embodiments, the silicon nitride is formed by PVD, ALD, HDPCVD, other suitable methods, and/or combinations thereof.

Figure 2:
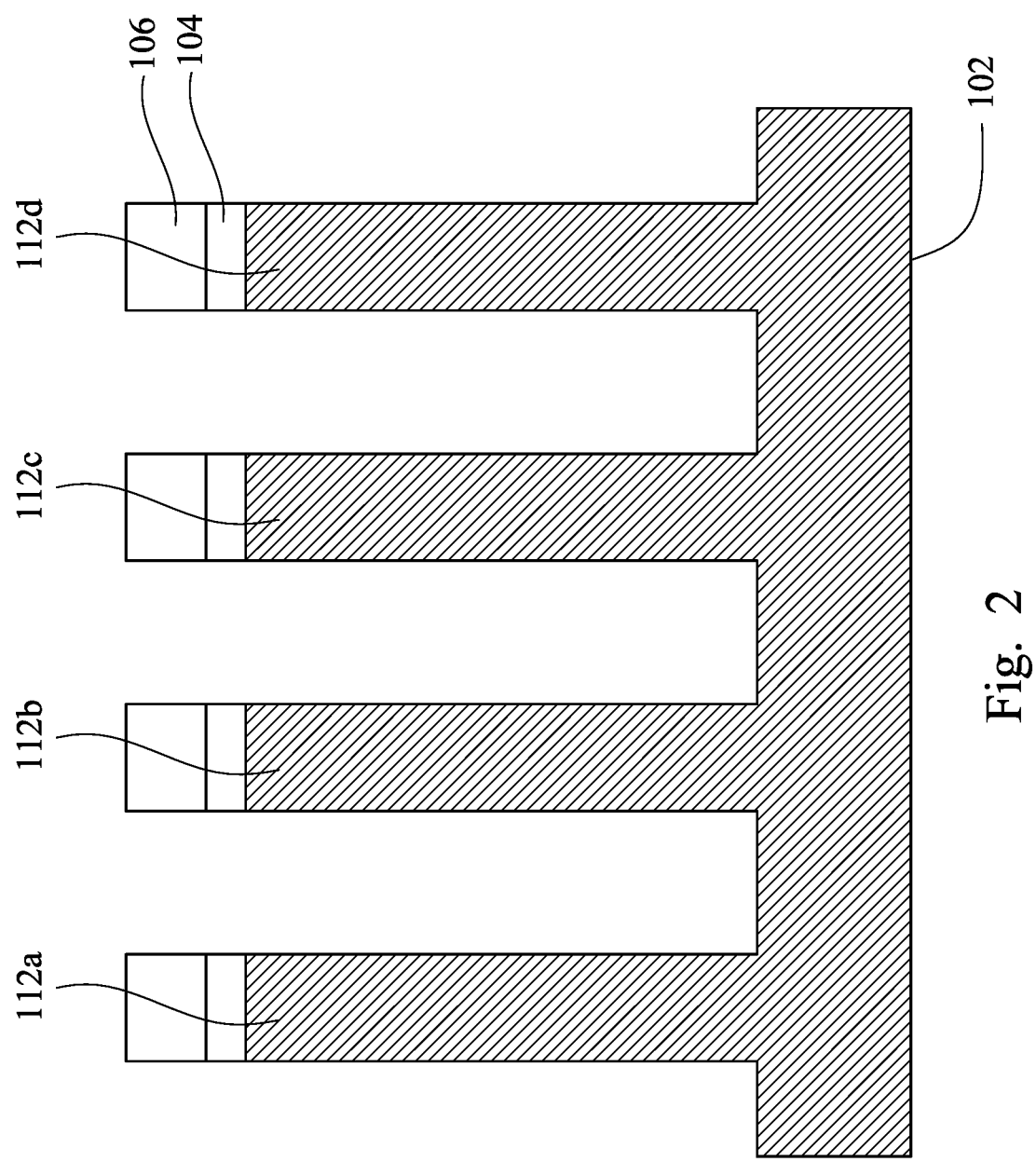

Then, the patterned photoresist layer 108 is formed over the mask layer 106. In some embodiments, the patterning of the photoresist layer 108 includes photoresist coating, soft baking, mask aligning, exposing pattern, post-exposure baking, developing photoresist, and hard baking. Thereafter, the mask layer 106 and pad layer 104 are etched through the patterned photoresist layer 108 so as to expose underlying substrate 102. The exposed substrate 102 is then etched to a plurality of fins 112a, 112b, 112c, and 112d, in which the resulting structure is shown in FIG. 2. The etching process may include a wet etching process, a dry etching process, or a combination thereof. The fins 112a-112d may be formed by an etching process using a reactive ion etch (RIE) and/or other suitable process. In some embodiments, a hydrofluoric acid (HF) or buffered HF may be used to etch the pad layer 104 to expose the substrate 102 according to the pattern of the patterned photoresist layer 108. In some embodiments, a dry etching process used to etch the substrate 102 includes a chemistry including fluorine-containing gas. In furtherance of the example, the chemistry of the dry etch includes $CF_4$, $SF_6$, or $NF_3$. In some embodiments, the fins 112a-112d are formed by a double-patterning lithography (DPL) process. The DPL process is a method of constructing a pattern on a substrate by dividing the pattern into two interleaved patterns. The DPL process allows enhanced feature (e.g., fin) density. Various DPL methodologies may be used including double exposure (e.g., using two mask sets).

Figure 3:
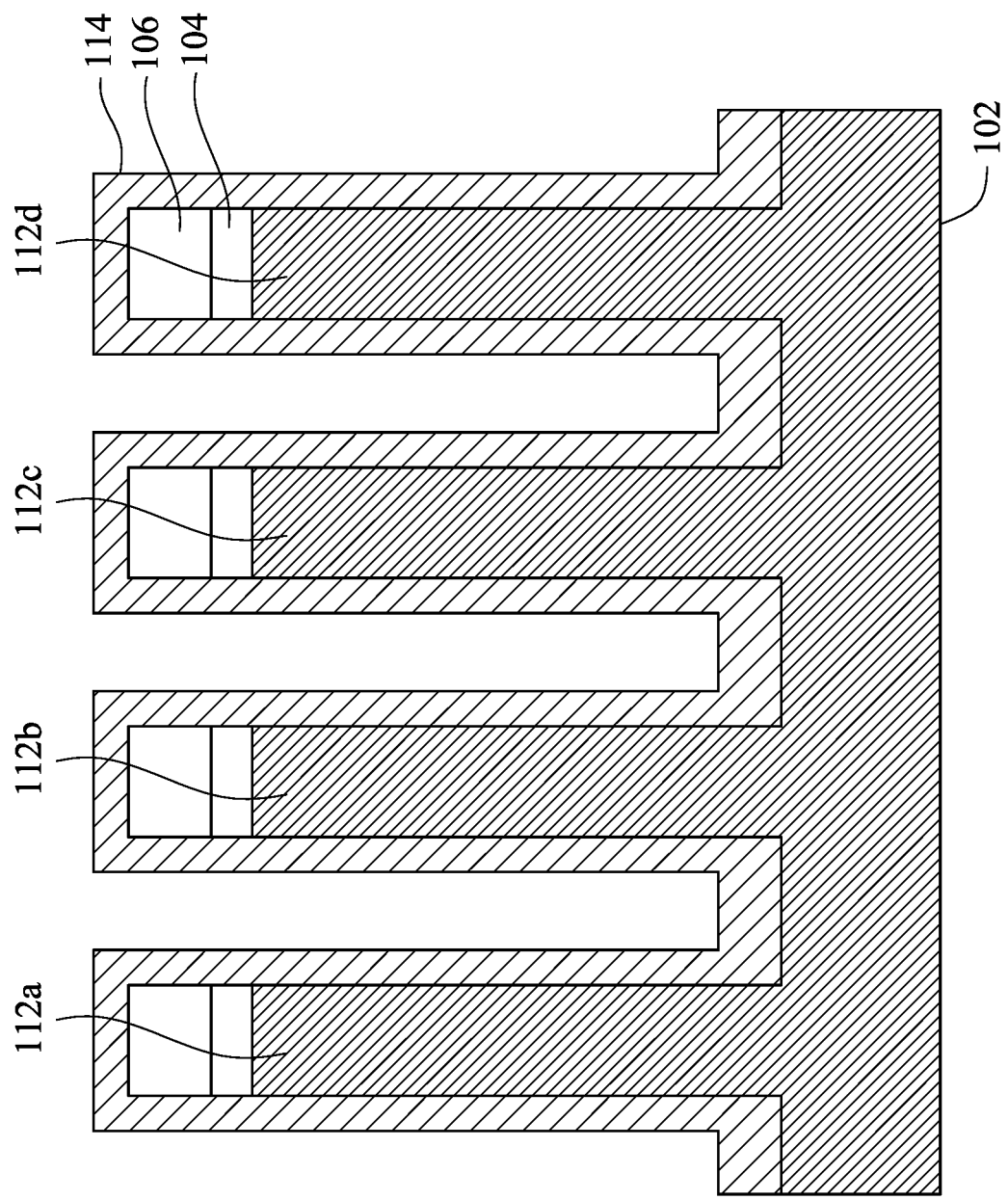

As shown in FIG. 3, a liner layer 114 is blanket formed over the substrate 102 and on the fins 112a-112d. In some embodiments, the liner layer 114 includes a dielectric material such as silicon nitride, silicon oxynitride, silicon carbide, or combinations thereof. In some embodiments, the liner layer 114 is formed as a conformal layer over the fins 112a-112d and the substrate 102.

Figure 4:
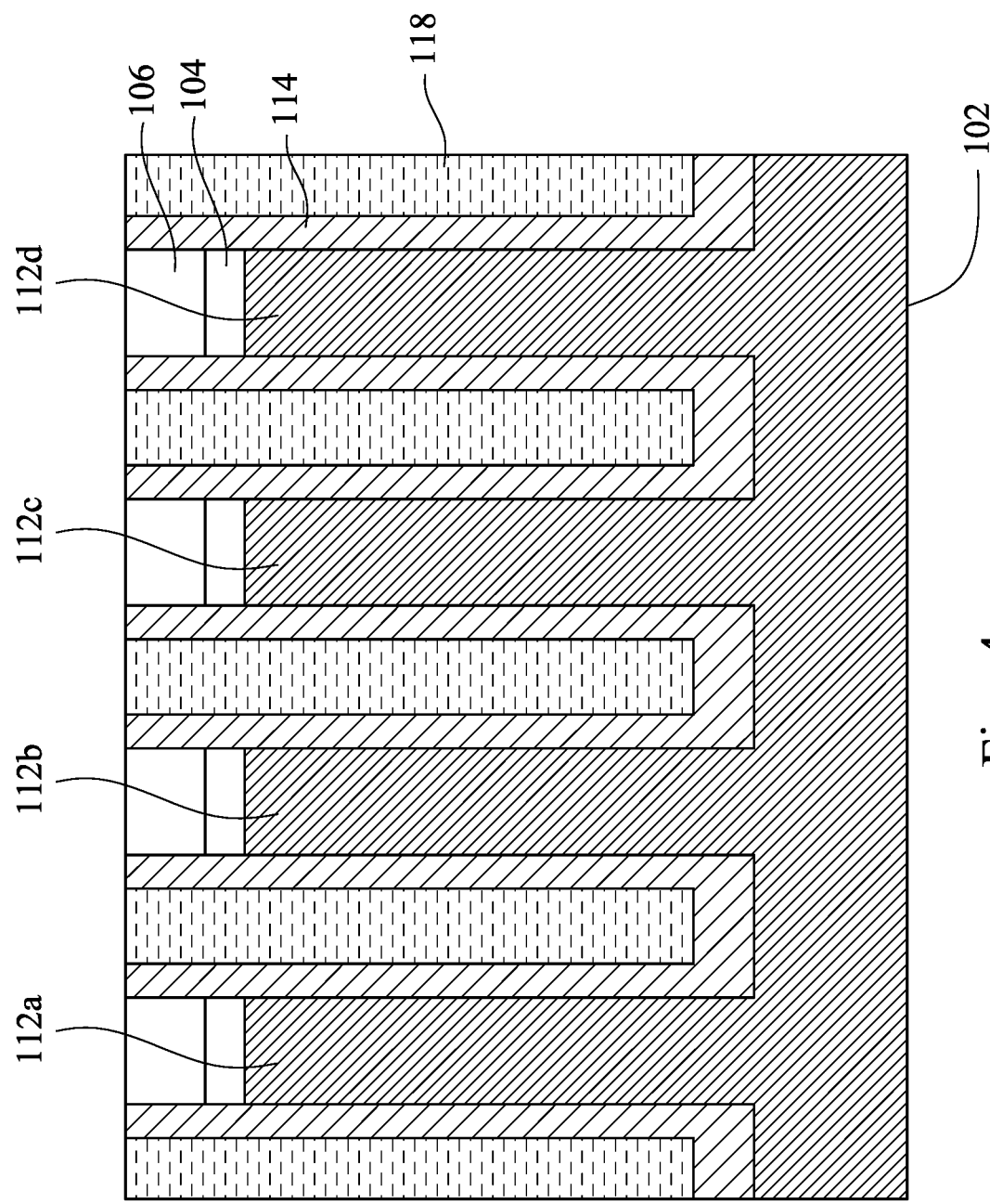

As shown in FIG. 4, a first isolation dielectric 118 is formed over the substrate 102 and the fins 112a-112d. The first isolation dielectric 118 surrounds and isolates the fins 112a-112d. In some embodiments, the first isolation dielectric 118 includes a dielectric material such as silicon oxide, silicon nitride, silicon oxynitride, low k materials, air gap, other suitable material, or combinations thereof. In some embodiments, the silicon oxide is deposited by a CVD process. In some embodiments, the silicon oxide is formed by PVD, ALD, HDPCVD, other suitable methods, and/or combinations thereof. The silicon oxide may be alternatively formed by a high aspect ratio process (HARP). In some embodiments, the first isolation dielectric 118 may have a multi-layer structure. In some embodiments, a planarizing process is performed to remove excess first isolation dielectric 118 until reaching the mask layer 106. In some embodiments, the planarizing process includes a chemical mechanical polishing (CMP) process. In some embodiments, the mask layer 106 serves as a polish stop layer for stopping the CMP process.

Figure 5:
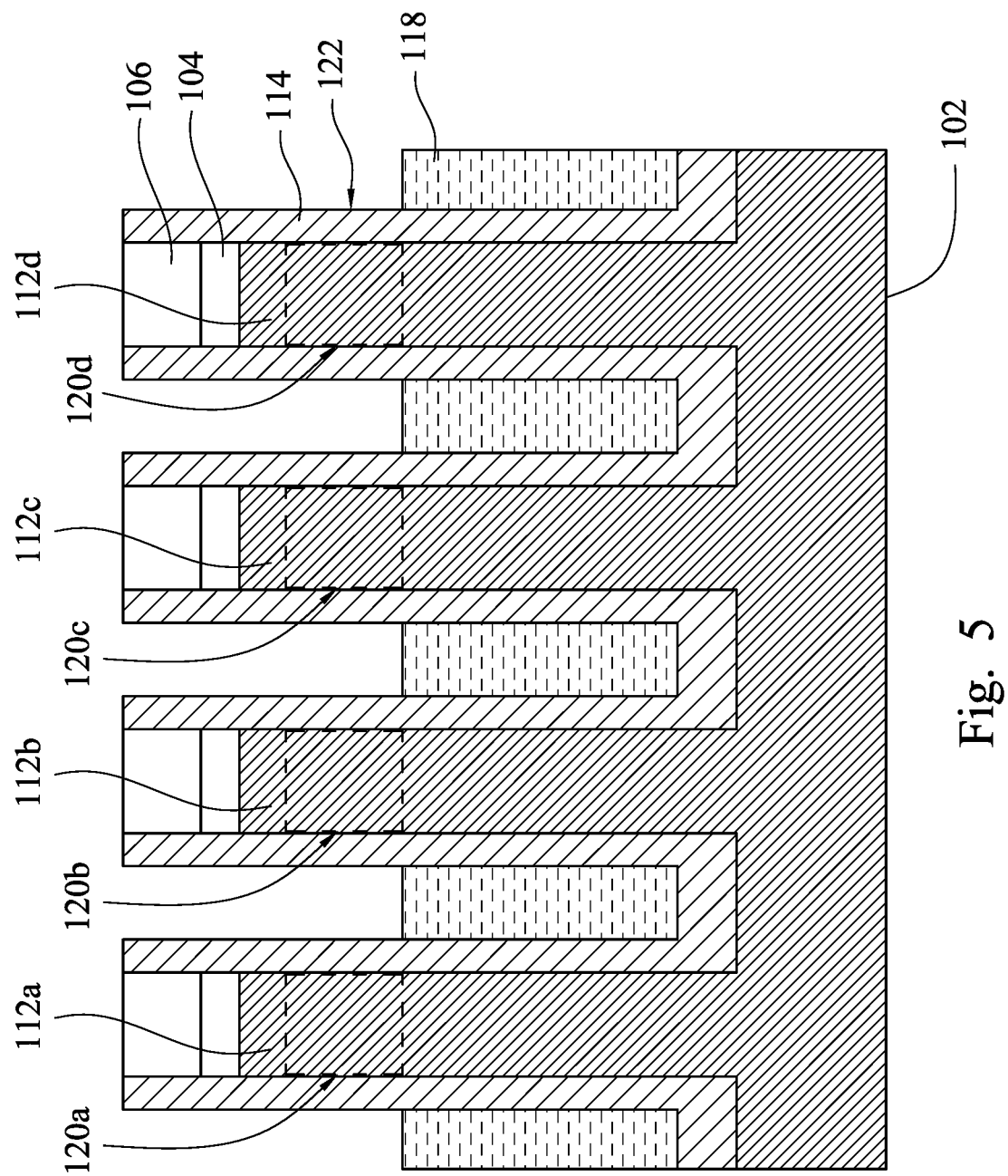

As shown in FIG. 5, an etching process is performed to recess the first isolation dielectric 118 such that the fins 112a-112d protrudes over the first isolation dielectric 118. The first isolation dielectric 118 can be referred to as shallow trench isolation (STI) in some embodiments. The upper portions of the fins 112a-112d above first isolation dielectric 118 can be referred to as channel regions 120a, 120b, 120c and 120d. In some embodiments, the etching process is used to etch back the first isolation dielectric 118 of FIG. 4, so as to expose a portion of sidewalls 122 of the liner layer 114. The etching process may include a wet etching, a dry etching process, or a combination thereof. In some embodiments, diluted hydrofluoric acid (HF), SICONI (SICONI is a registered trademark of Applied Materials, Inc.) (including HF and ammonia ($NH_3$)), or the like, may be used as the etchant.

Figure 6:
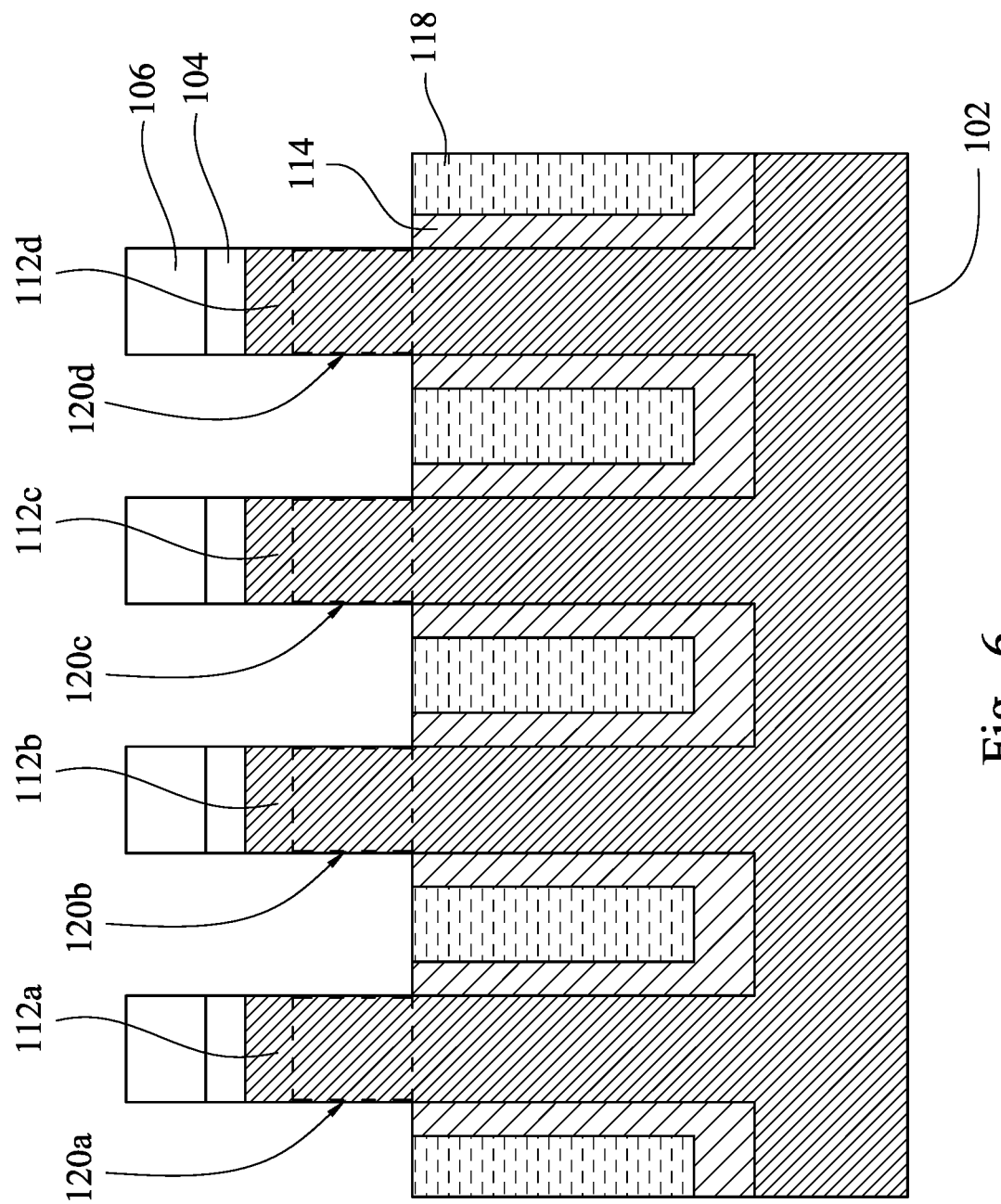

As shown in FIG. 6, an etching process is performed to remove exposed portions of the liner layer 114 to expose upper portions of the fins 112a-112d above the first isolation dielectric 118. That is, the channel regions 120a-120d are exposed. In some embodiments, the etching process performed to the liner layer 114 may include a wet etching, a dry etching process, or a combination thereof. In some embodiments, the first isolation dielectric 118 has higher etch resistance to an etchant used in the etching process than that of the liner layer 114, and hence portions of liner layer 114 lower than a top surface of the first isolation dielectric 118 can be protected from the etching process.

Figure 7:
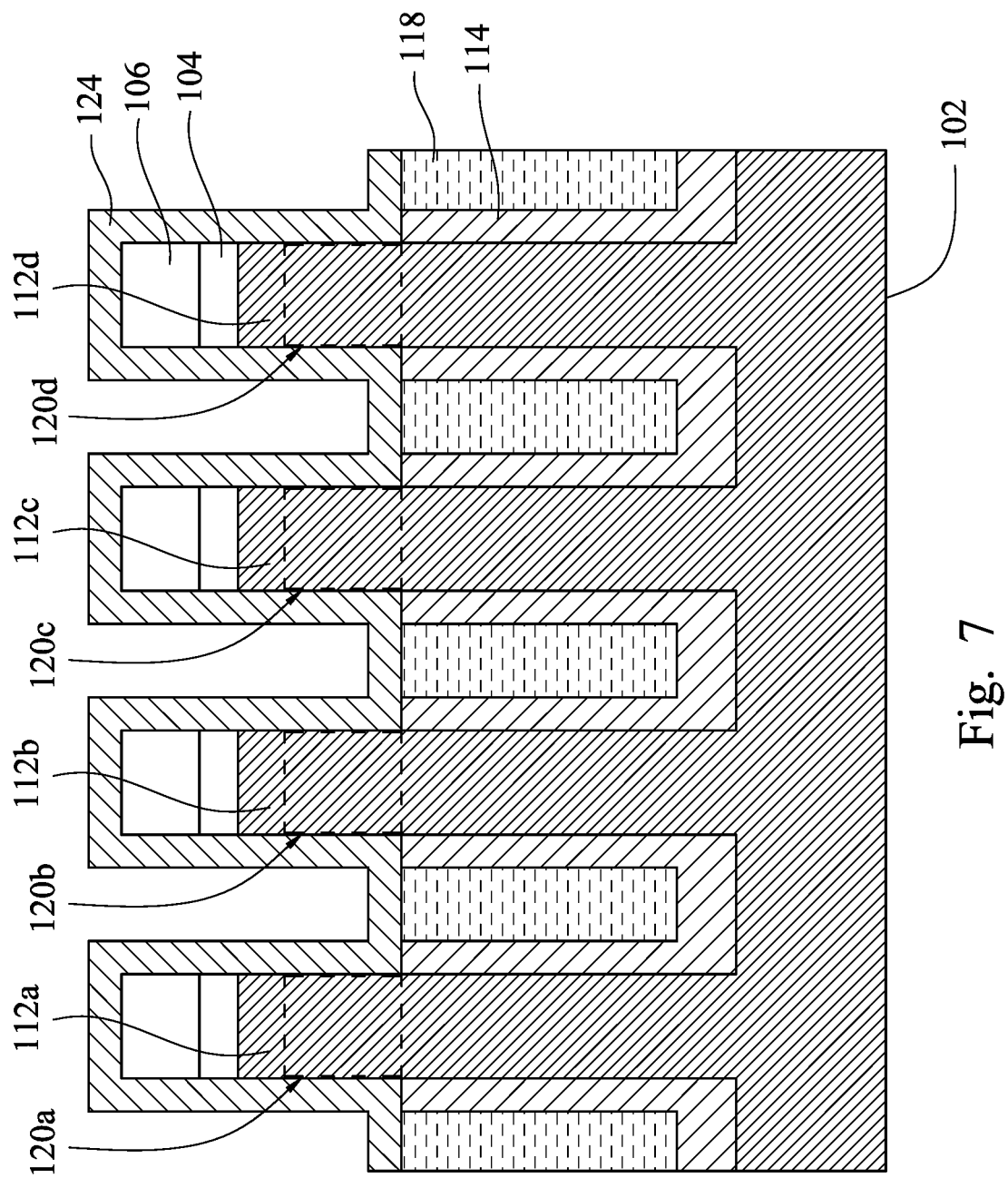

As shown in FIG. 7, a spacer layer 124 is blanket formed over the exposed fins 112a-112d, and thus sidewalls of the channel regions 120a-120d are covered with the spacer layer 124. Therefore, the spacer layer 124 can protect the channel regions 120a-120d from the subsequent processes, and hence the spacer layer 124 can be referred to as a protective layer enclosing the channel regions 120a-120d of the fins 112a-112d. In some embodiments, the spacer layer 124 includes a dielectric material, such as silicon nitride (SiN), silicon carbon nitride (SiCN) or silicon oxygen carbon nitride (SiOCN), which has different etch selectivity than that of the liner layer 114 so as to selectively etch the underlying liner layer 114 in a subsequent step. The spacer layer 124 is formed by any suitable process, such as, CVD, PVD, and ALD. In some embodiments, the deposition of the spacer layer 124 may be a conformal process.

Figure 8:
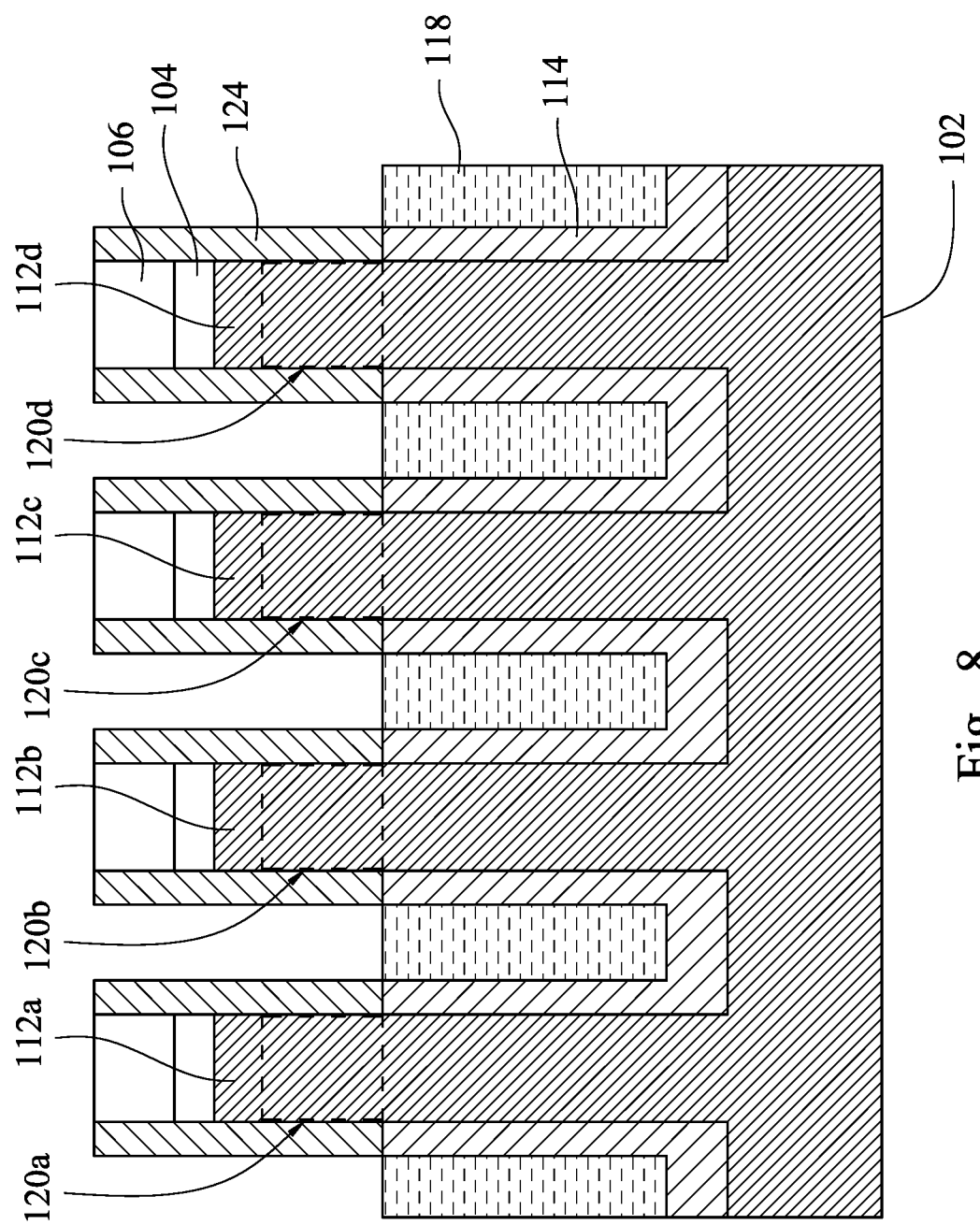

As shown in FIG. 8, an etching process is performed to remove horizontal portions of the spacer layer 124, while remaining vertical portions of the spacer layer 124 on sidewalls of the fins 112a-112d to act as spacers. The etching of the spacer layer 124 may be, for example, anisotropic etching.

Figure 9:
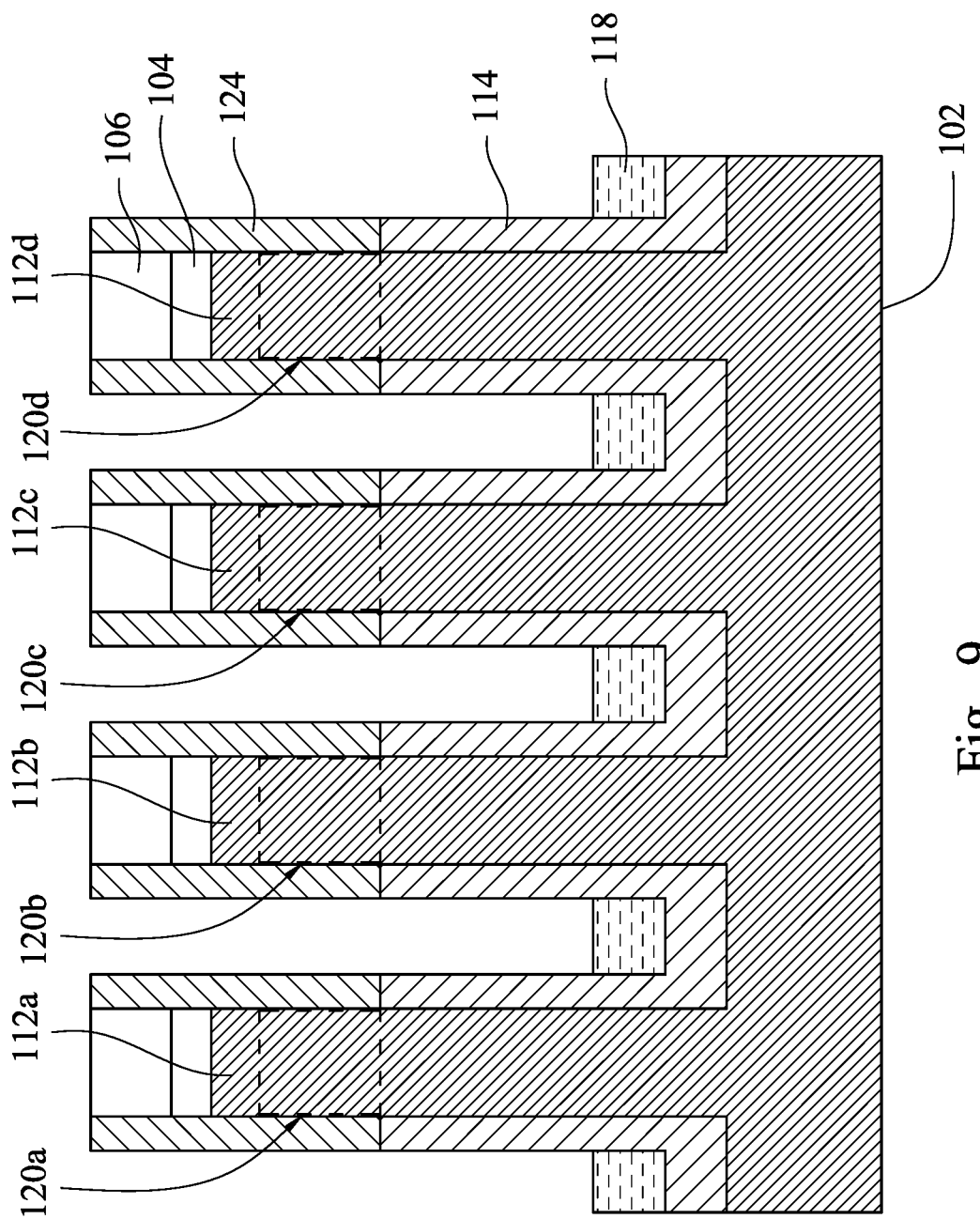

As shown in FIG. 9, the first isolation dielectric 118 is etched back to expose portions of the liner layer 114. The etching process may include a wet etching, a dry etching process, or a combination thereof. The etching process may include a wet etching, a dry etching process, or a combination thereof. In some embodiments, diluted HF, SiCoNi (including HF and $NH_3$), or the like, may be used as the etchant. In some embodiments, the liner layer 114 has higher etch resistance to the etchant used in the etching back than that of the first isolation dielectric 118, and hence the liner layer 114 can be protected from the etching back. Similarly, the spacer layer 124 has higher etch resistance to the etchant used in the etching back than that of the first isolation dielectric 118, and hence the spacer layer 124 can be protected from the etching back. Since the sidewalls of the channel regions 120a-120d are covered by the spacer layer 124 and top surfaces of the channel regions 120a-120d are covered by the pad layer 104 and mask layer 106, the channel regions 120a-120d can be protected from the etching back.

Figure 10:
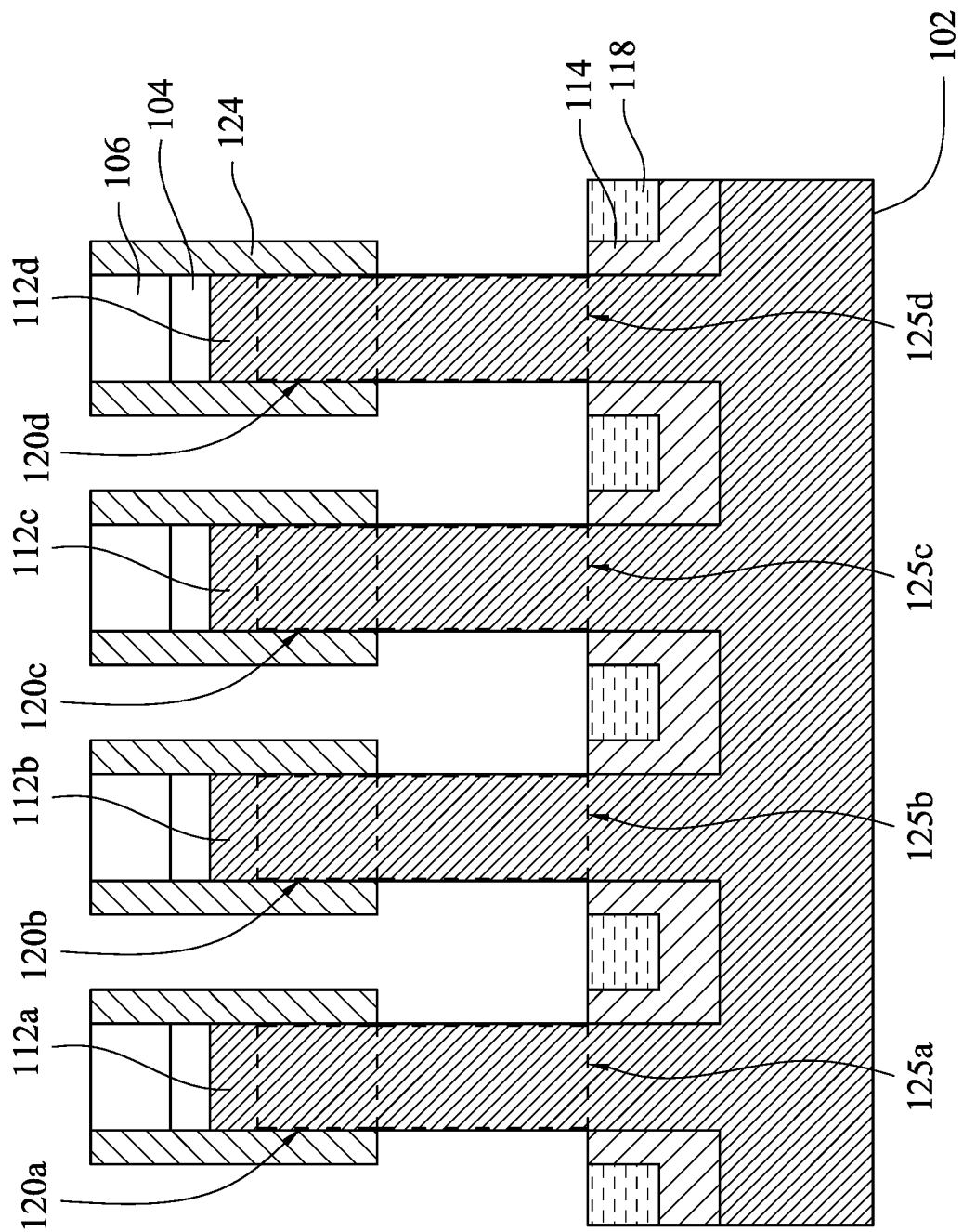

As shown in FIG. 10, an etching process is performed to remove the exposed portions of the liner layer 114 to expose the bottom portions of the fins 112a-112d below the spacer layer 124, in which the bottom portions of the fins 112a, 112b, 112c, and 112d below the spacer layer 124 can be referred to as source regions 125a, 125b, 125c, and 125d. In some embodiments, the etching process performed to the liner layer 114 may include a wet etching, a dry etching process, or a combination thereof. In some embodiments, the first isolation dielectric 118 has higher etch resistance to an etchant used in the etching process than that of the liner layer 114, and hence portions of liner layer 114 lower than a top surface of the first isolation dielectric 118 can be protected from the etching process. Similarly, the spacer layer 124 has higher etch resistance to the etchant used in the etching back than that of the liner layer 114, and hence the spacer layer 124 can be protected from the etching back. Since the sidewalls of the channel regions 120a-120d are covered by the spacer layer 124 and the top surfaces of the channel regions 120a-120d are covered by the pad layer 104 and mask layer 106, the channel regions 120a-120d can be protected from the etching back.

Figure 11:
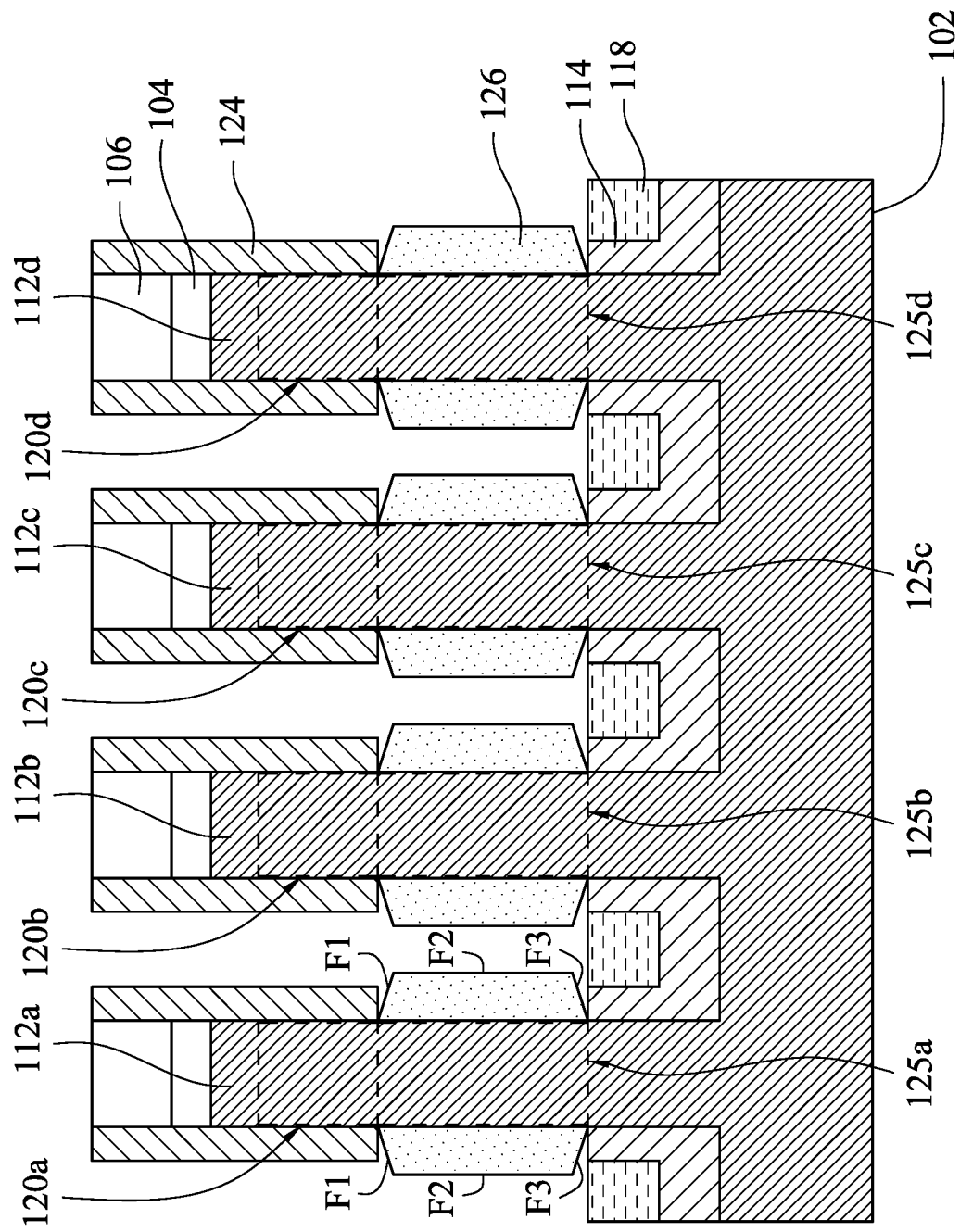

As shown FIG. 11, epitaxy source features 126 are grown from the source regions 125a-125d of the fins 112a-112d (e.g., the exposed portions of the fins 112a-112d) using an epitaxy or epitaxial (epi) process. That is, the epitaxy source feature 126 is epitaxially grown from the bottom portions of the fins 112a-112d, and the epitaxy source feature 126 surrounds the bottoms of the fins 112a-112d. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fins 112a-112d. In some embodiments, the epitaxy source feature 126 is made of boron-doped silicon germanium (SiGeB) or silicon phosphide (SiP), and the epitaxy source feature 126 serves as a source electrode for a field effect transistor (FET). In some embodiments, the epitaxy source feature 126 includes facets F1, F2 and F3. The facets F1 are upward facing facets, the facets F2 are vertical facets, and the facets F3 are downward facing facets. In some embodiments, the facets F1 and F3 may be on (111) planes of the epitaxy source feature 126. In some embodiments, the facets F2 may be on (110) planes of the epitaxy source feature 126.

Furthermore, since the channel regions 120a-120d are formed prior to the growth of the epitaxy source features 126, the channel regions 120a-120d may be not susceptible to the quality of the epitaxy source features 126. For example, if thick epitaxy source features 126 are desired, defects such as high surface roughness of the epitaxy source features 126 may be formed, which would adversely affect epitaxy growth of channel regions if the channel regions are grown after the growth of the thick epitaxy source features 126. However, the channel regions 120a-120d are not susceptible to the defects of the thick epitaxy source features 126 because the channel regions 120a-120d are formed prior to formation of these defects. In some embodiments, since the channel regions 120a-120d are formed in advance, the surface roughness of the epitaxy source features 126 does not affect the surface roughness of the channel regions 120a-120d. Therefore, surface roughness of the channel regions 120a-120d is less than surface roughness of the epitaxy source features 126 in some embodiments. As a result, improved qualities of the channel regions 120a-120d can be obtained even if growth of the epitaxy source features 126 induces defects.

Figure 12:
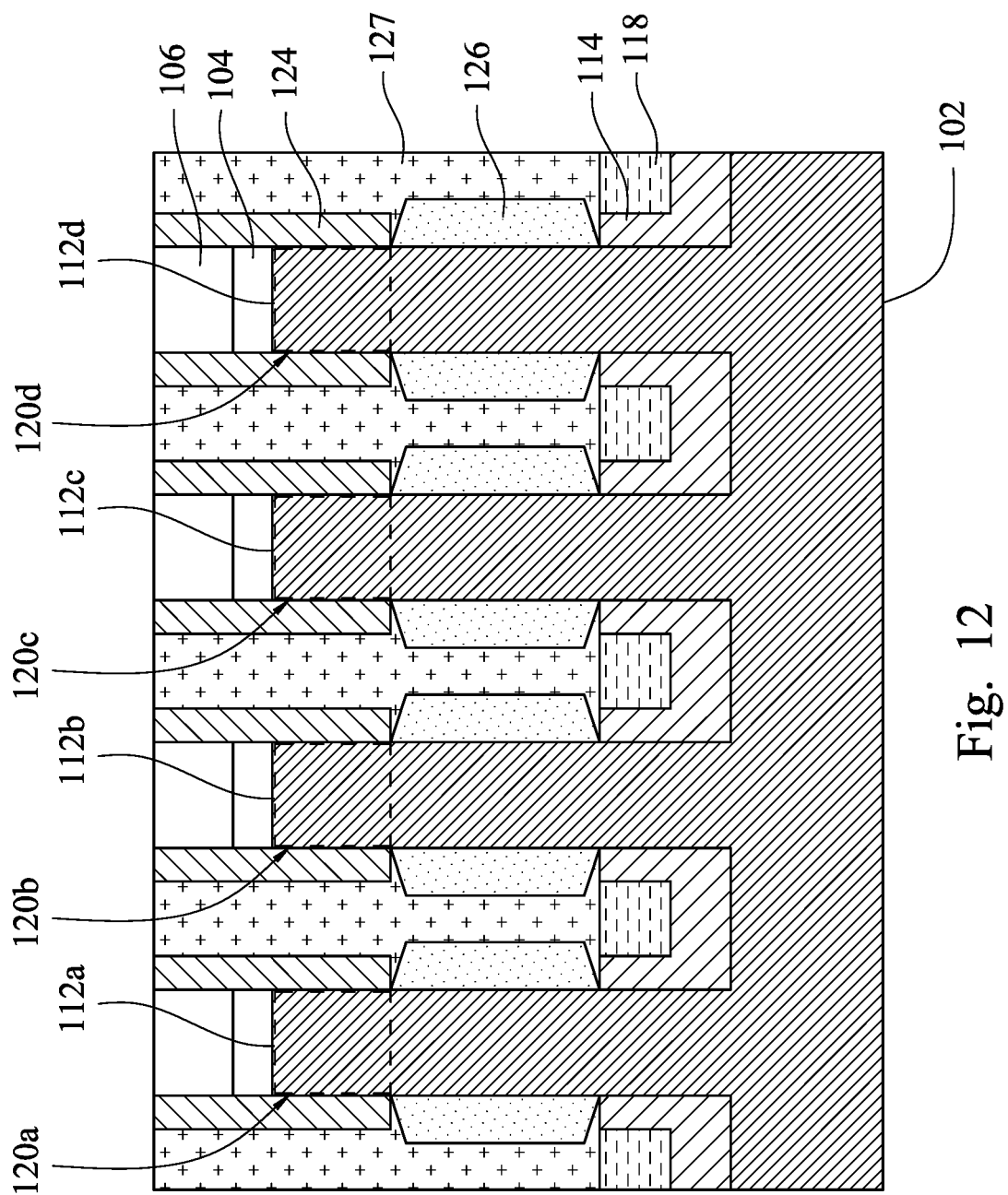

As shown in FIG. 12, second isolation dielectric 127 is formed to fill trenches between any two adjacent of the fins 112a-112d, so that the epitaxy source features 126 and the spacer layer 124 are covered with the second isolation dielectric 127. Thereafter, a planarizing process is performed to remove excess second isolation dielectric 127 until reaching the mask layer 106. In some embodiments, the planarizing process includes a CMP process. In some embodiments, the mask layer 106 serves as a polish stop layer for stopping the CMP process.

Figure 13:
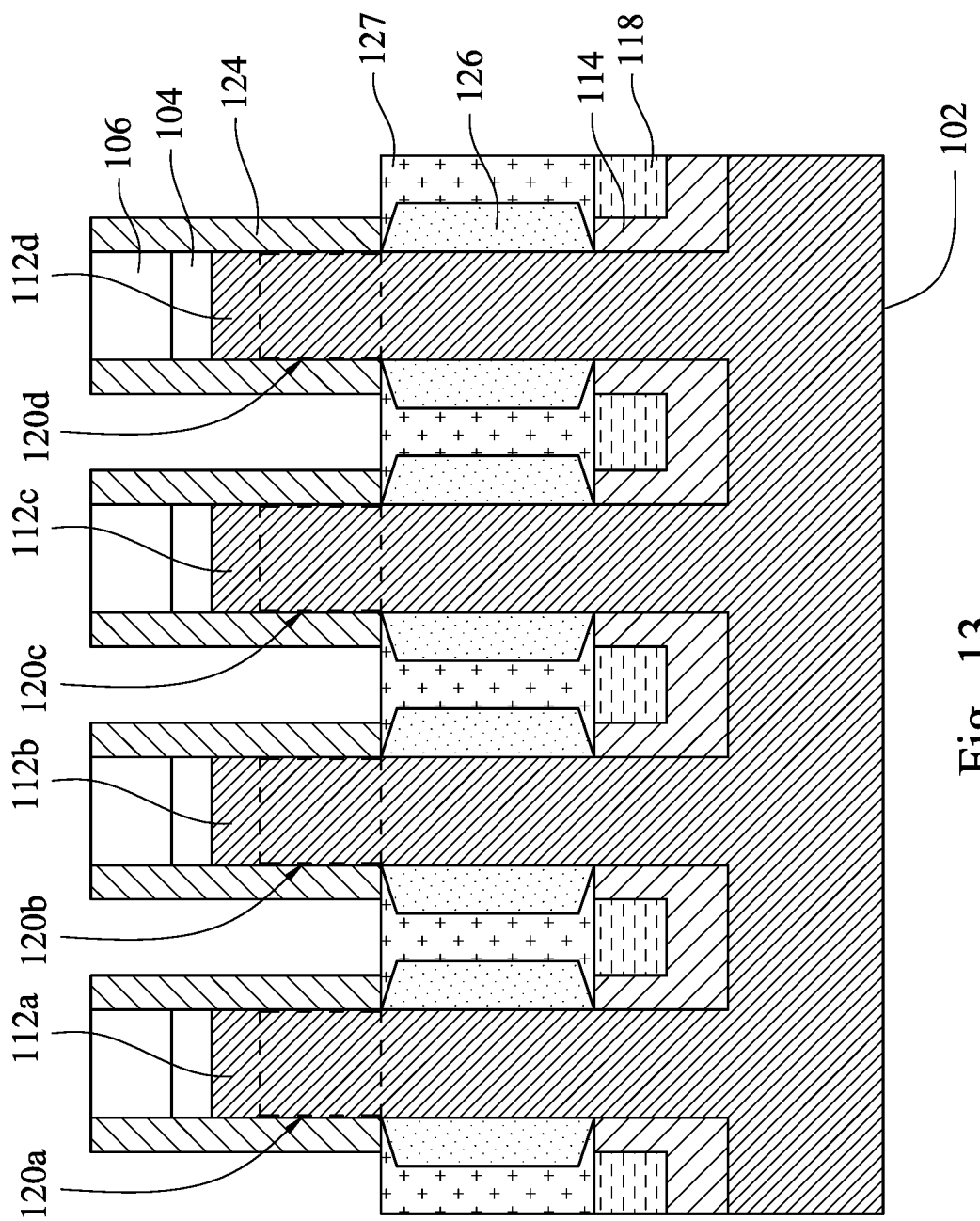

As shown in FIG. 13, the second isolation dielectric 127 is etched back to expose the spacer layer 124. After the second isolation dielectric 127 is etched back, the isolation dielectric is recessed, in which the epitaxy source features 126 are covered with the second isolation dielectric 127. That is, the process of etching back the second isolation dielectric 127 stops before the epitaxy source features 126 is exposed. The etching process may include a wet etching, a dry etching process, or a combination thereof. The etching process may include a wet etching, a dry etching process, or a combination thereof. In some embodiments, diluted HF, SiCoNi (including HF and NH$_3$), or the like, may be used as the etchant. In some embodiments, stopping the process of etching back can be achieved by controlling the etching time or the etching depth. In some embodiments, the spacer layer 124 has higher etch resistance to the etchant used in the etching back than that of the first isolation dielectric 118, and hence the spacer layer 124 can be protected from the etching back. Since the sidewalls of the channel regions 120a-120d are covered by the spacer layer 124 and the top surfaces of the channel regions 120a-120d are covered by the pad layer 104 and mask layer 106, the channel regions 120a-120d can be protected from the etching back.

Figure 14:
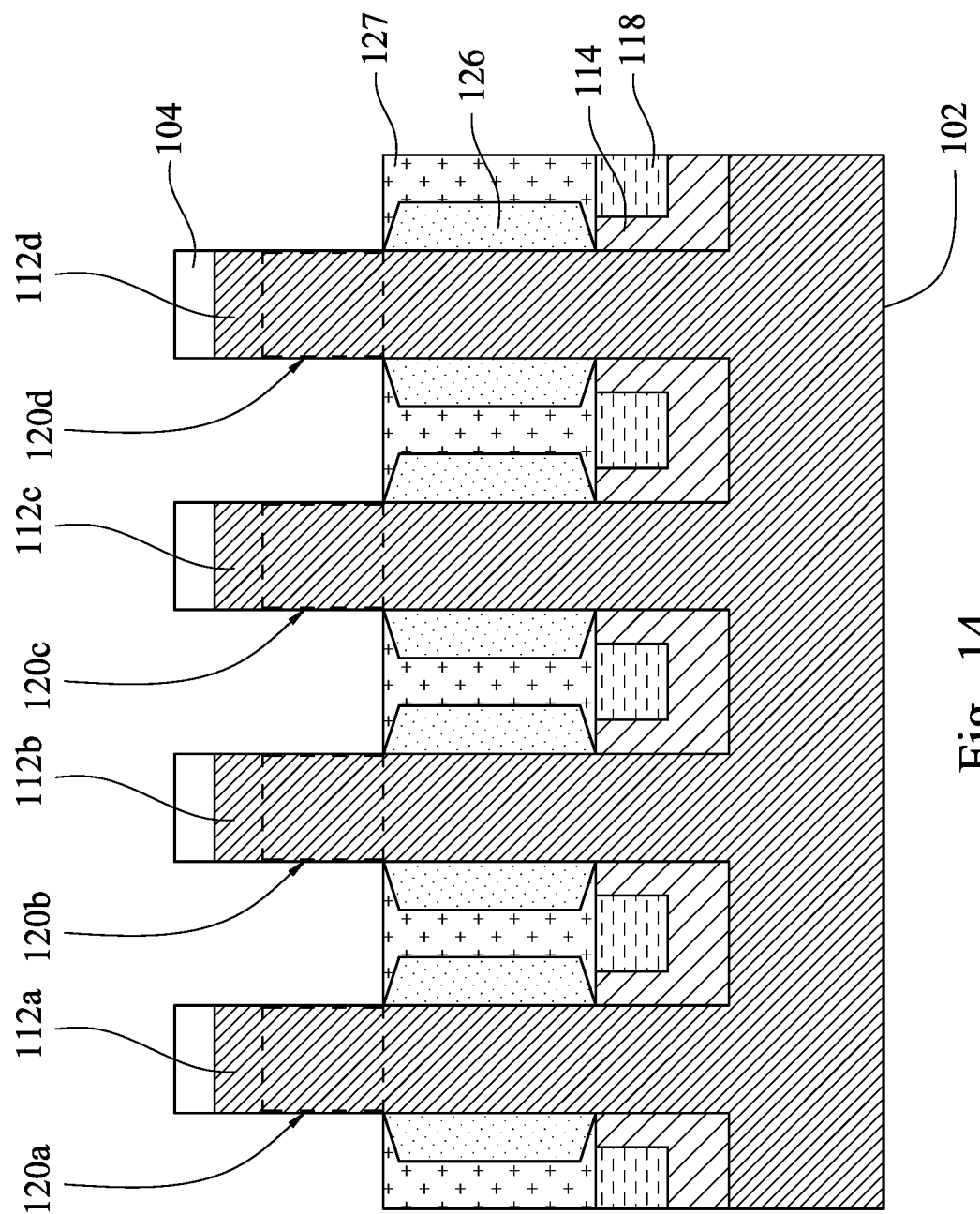

Thereafter, one or more etching processes are performed to remove the spacer layer 124 and the mask layer 106, and the resulting structure is shown in FIG. 14. The etching process may include a wet etching, a dry etching process, or a combination thereof. An exemplary method of removing the etching process is wet etching which is able to selectively remove silicon nitride, and this wet etching utilizes hot (approximately 145° C.-180° C.) phosphoric acid (H$_3$PO$_4$) solutions with water. In some embodiments, the second isolation dielectric 127 and pad layer 104 has higher etch resistance to the etchant used in the etching process than that of the spacer layer 124, and hence the first isolation dielectric 118 and pad layer 104 can be not removed by the etching process. After the etching process, channel regions 120a-120d of the fins 112a-112d are exposed.

Figure 15:
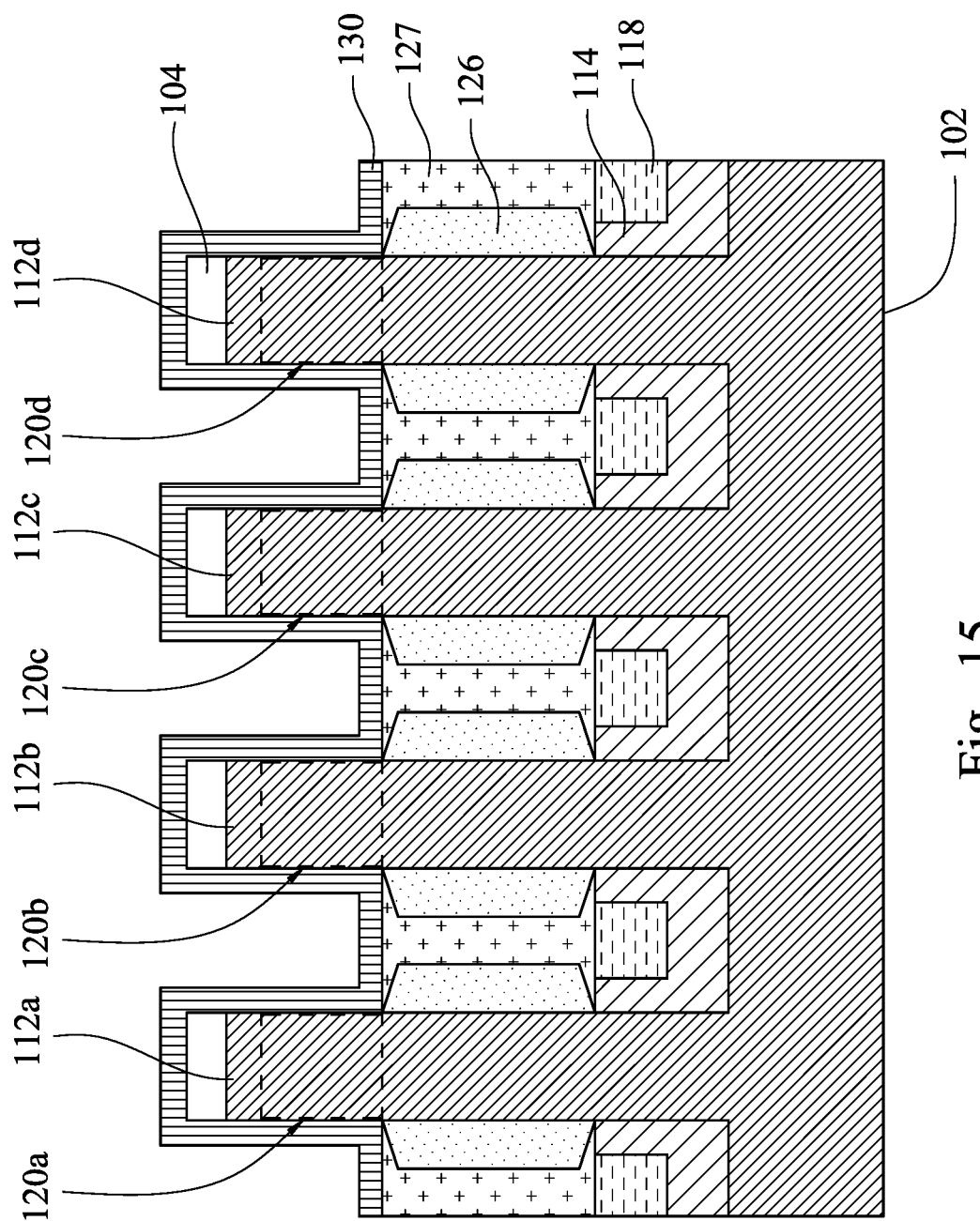

As shown in FIG. 15, a gate dielectric layer 130 is blanket formed over the exposed fins 112a, 12b, 112c, and 112d, and thus the channel regions 120a-120d are enclosed by with the gate dielectric layer 130. In some embodiments, the gate dielectric layer 130 includes an interfacial layer (IL) which includes, for example, a silicon oxide (SiO$_2$) layer. In some embodiments, the IL includes HfSiO or SiON. In some embodiments, the IL is formed by ALD, CVD, thermal oxidation, wet oxidation, radical oxidation (RadOx) or combinations thereof. In some embodiments, the IL includes a chemical SiO$_2$ layer with hydroxyl groups. In some embodiments, the gate dielectric layer 130 includes a high-k (HK) dielectric layer formed over the IL by ALD, CVD, metal organic CVD (MOCVD), PVD, combinations thereof, or other suitable techniques. In some embodiments, the HK dielectric layer includes a binary or ternary high-k film such as HfOx. In some embodiments, the HK dielectric layer includes other HK dielectrics such as LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides, or other suitable materials.

Figure 16:
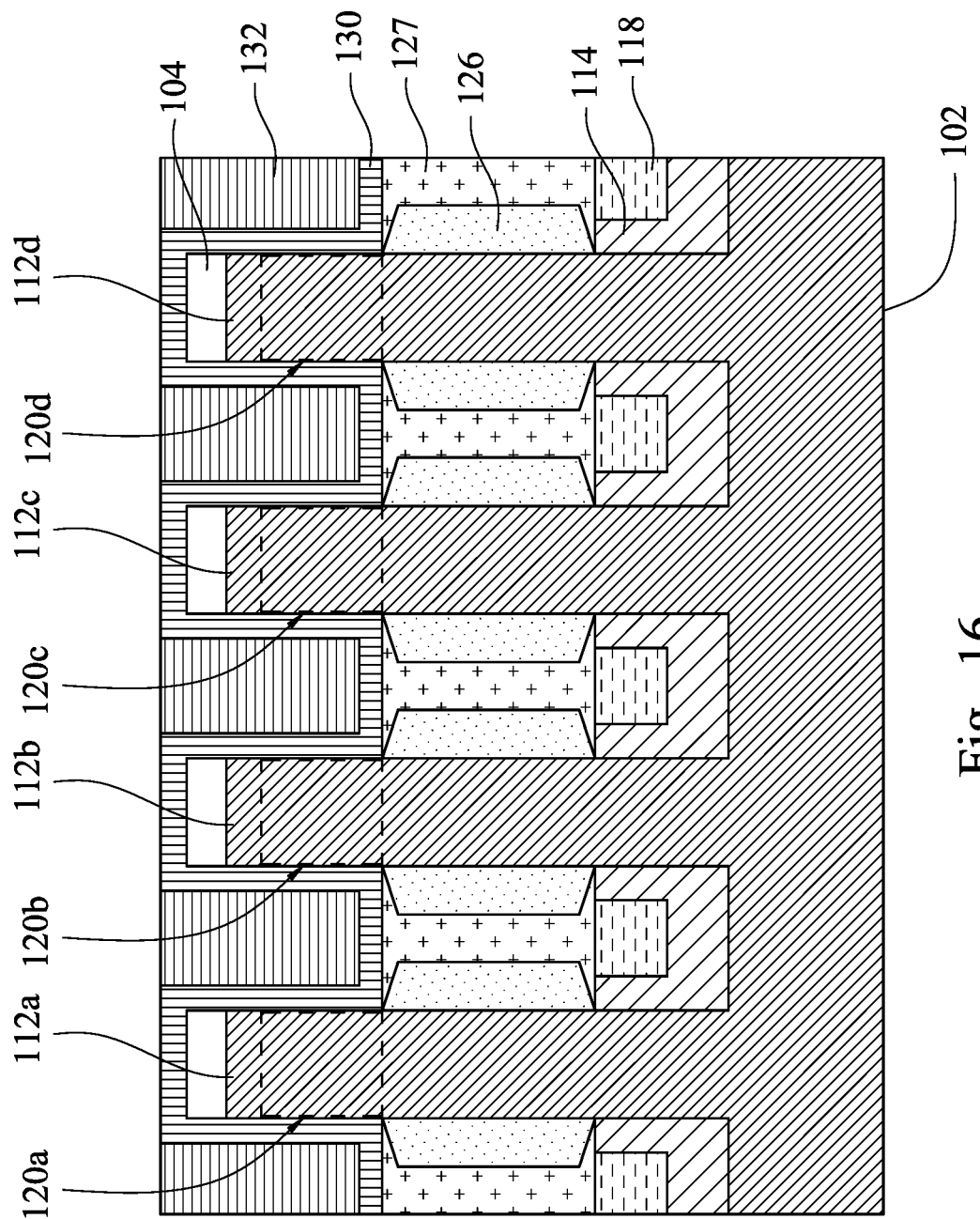

As shown in FIG. 16, a metal gate 132 is formed into recesses of the gate dielectric layer 130, and a planarization process, such as a CMP process, is then performed to remove the excess metal gate 132 until reaching the gate dielectric layer 130. Therefore, the metal gate 132 is around the channel regions 120a-120d of the fins 112a-112d, and thus each channel region is enclosed by the metal gate 132, so as to form a vertical gate-all-around (VGAA) device. The metal gate 132 and the gate dielectric layer 130 can be in combination referred to as a gate stack. If the gate dielectric layer 130 is a high-k dielectric layer, the gate stack can be referred to as a high-k metal gate (HKMG) stack. In addition, portions of the fins 112a-112d that are covered with the HKMG stack and the epitaxy source features 126 are formed as one piece. In some embodiments, the metal gate 132 includes, for example work function (WF) layers, barrier layers, fill metal layer, liner layer, wetting layer, and adhesion layer. In some embodiments, the metal gate 132 is formed by ALD, PVD, CVD, or other suitable process. For example, a Ti layer may be deposited to function as a wetting layer for a subsequent metal filling, in which the Ti layer may be formed by PVD or other suitable process.

Figure 17:
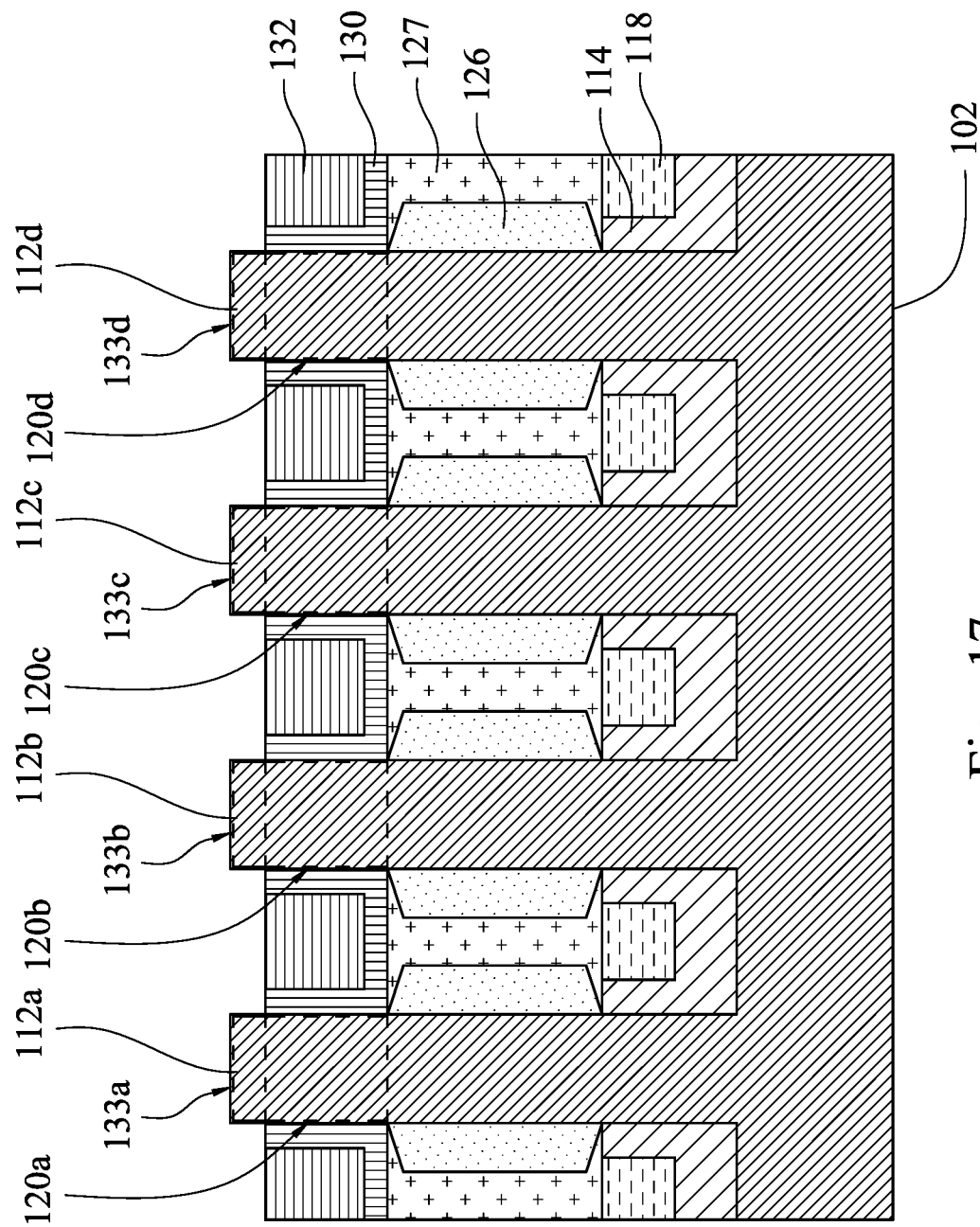

As shown in FIG. 17, an etching process is performed to remove upper portions of the gate dielectric layer 130 and the metal gate 132 such that tops of the fins 112a-112d protrude from the HKMG stack including the gate dielectric layer 130 and the metal gate 132. The protruding tops of the fins 112a-112d can be referred to as drain regions 133a, 133b, 133c, and 133d. The etching process may include a wet etching, a dry etching process, or a combination thereof. In addition, the etching process includes removing the pad layer 104 (see FIG. 16).

Figure 18:
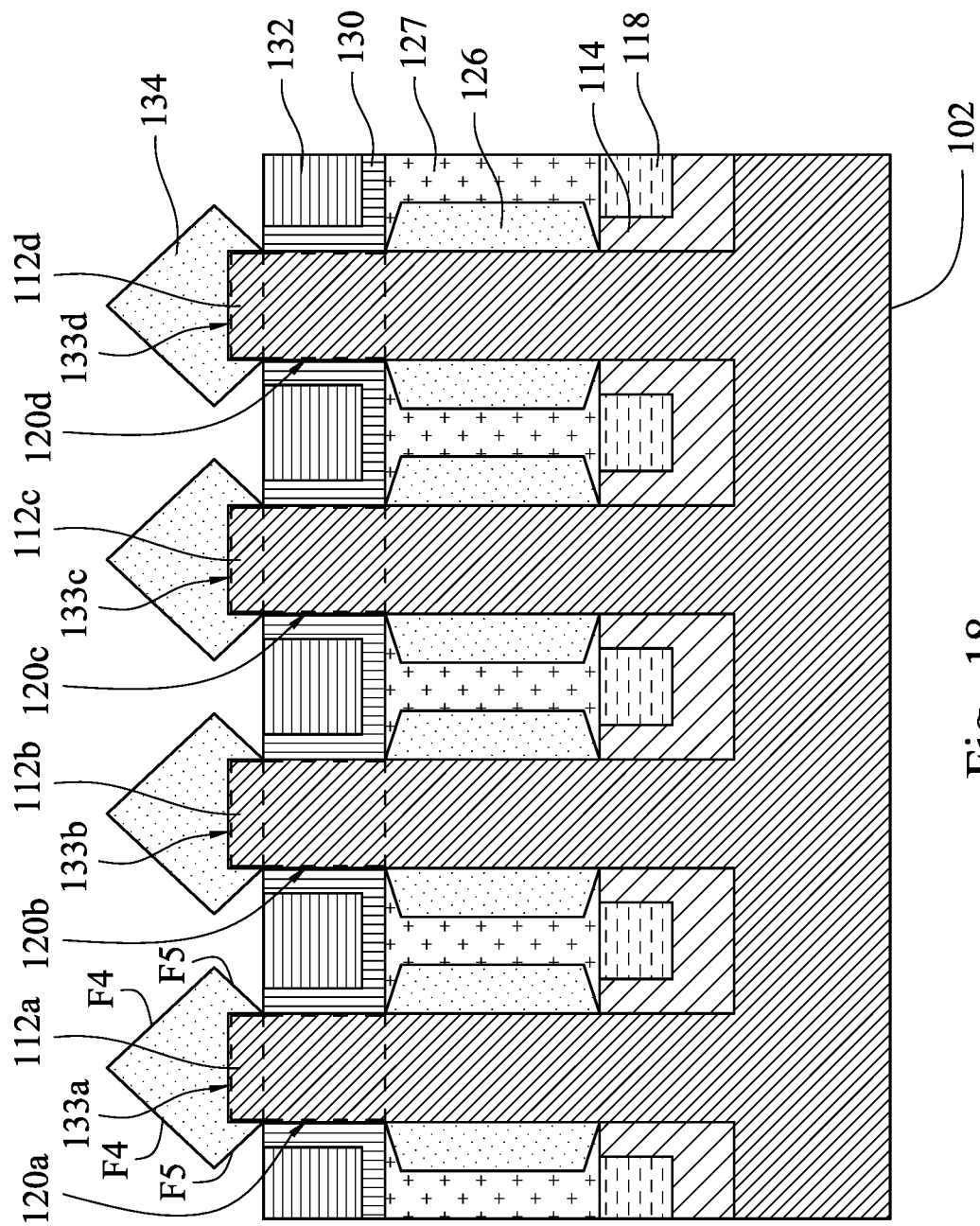

As shown in FIG. 18, epitaxy drain features 134 are grown from the drain regions 133a-133d of the fins 112a-112d (e.g., the exposed portions of the fins 112a-112d) using an epitaxy process. The channel regions 120a-120d are between the corresponding epitaxy source features 126 and the corresponding epitaxy drain features 134. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the fins 112a-112d. In some embodiments, the top surfaces of the fins 112a-112d are covered with the epitaxy drain features 134. In some embodiments, the epitaxy source features 126 and the epitaxy drain features 134 are made of the same material. In some embodiments, the epitaxy drain features 134 are made of boron-doped silicon germanium (SiGeB) or silicon photonics (SIP), and the epitaxy drain features 134 serve drain electrodes for the FETs. In some embodiments, the epitaxy drain feature 134 includes facets F4 and F5. For example, the facets F4 are upward facing facets, and the facets F5 are downward facing facets. In some embodiments, the facets F4 and F5 may be on (111) planes of the epitaxy drain feature 134.

Figure 19:
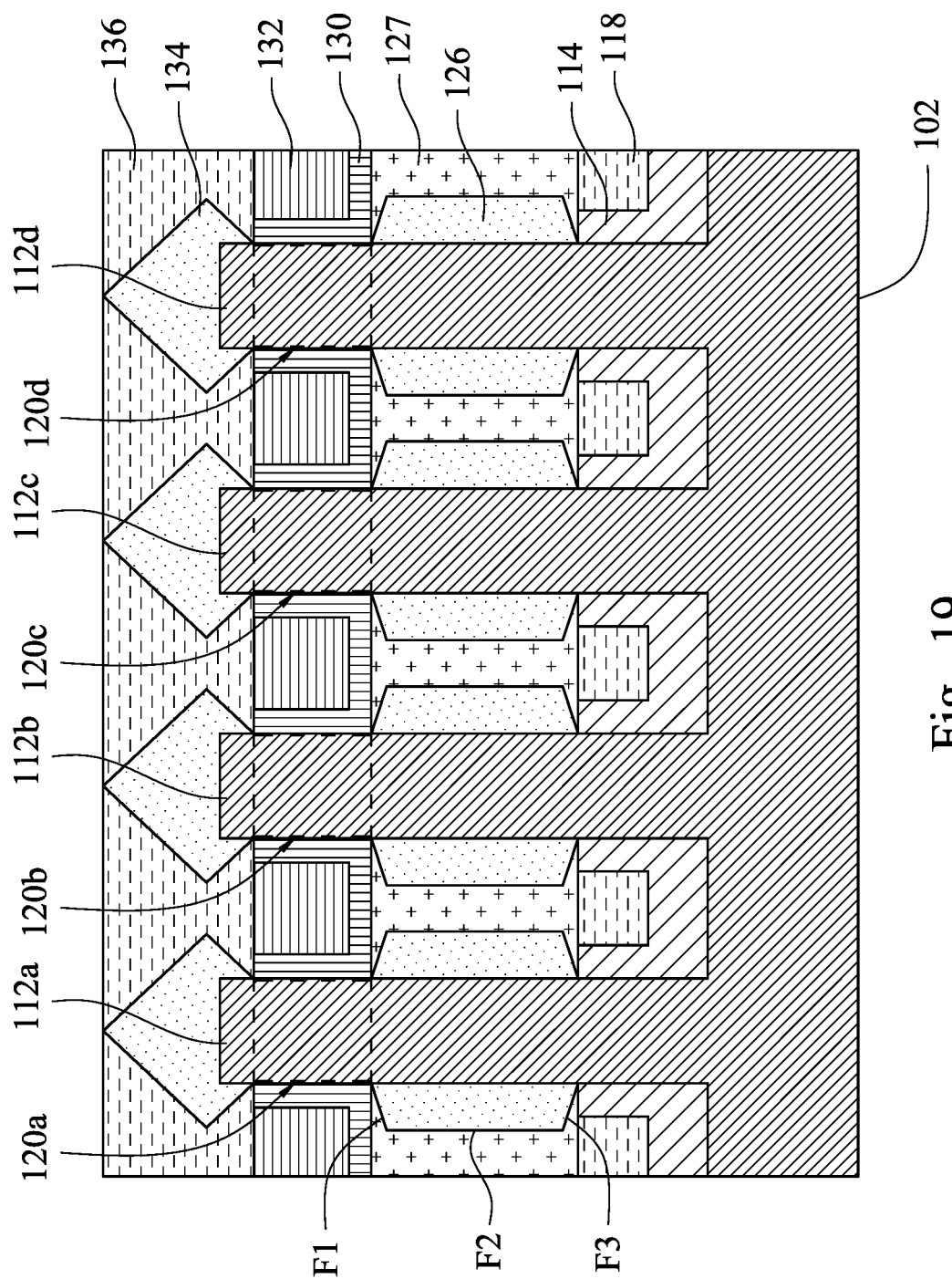

As shown in FIG. 19, an interlayer dielectric (ILD) layer 136 is formed to cover the epitaxy drain features 134, the gate dielectric layer 130 and the metal gate 132, and a planarization process (e.g. CMP) is performed to the ILD layer 136 until reaching the epitaxy drain features 134. In some embodiments, the ILD layer 136 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 136 may be formed using, for example, CVD, ALD, spin-on-glass (SOG) or other suitable techniques.

Figure 20:
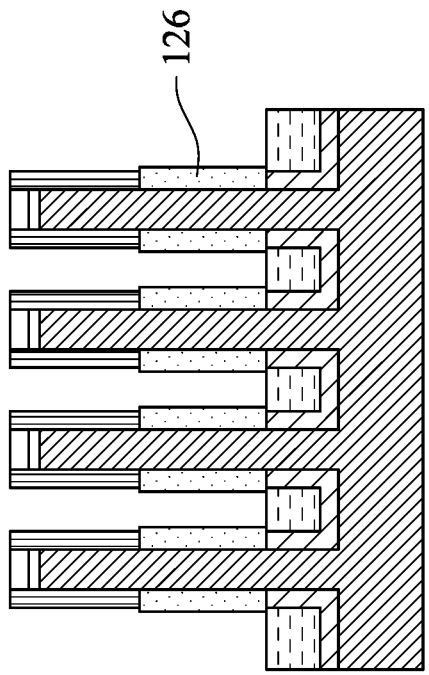
Figure 21:
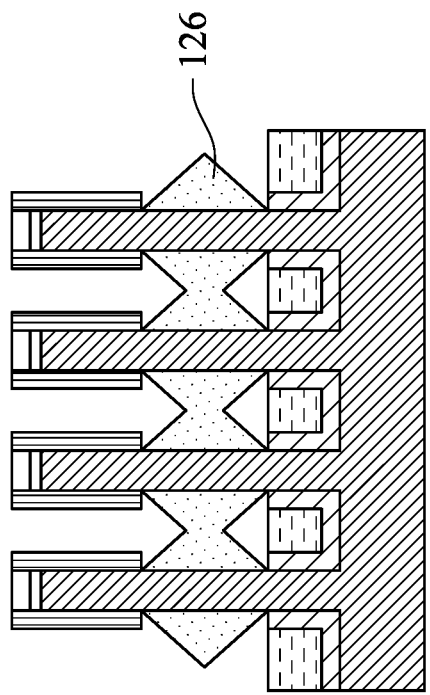
Figure 22:
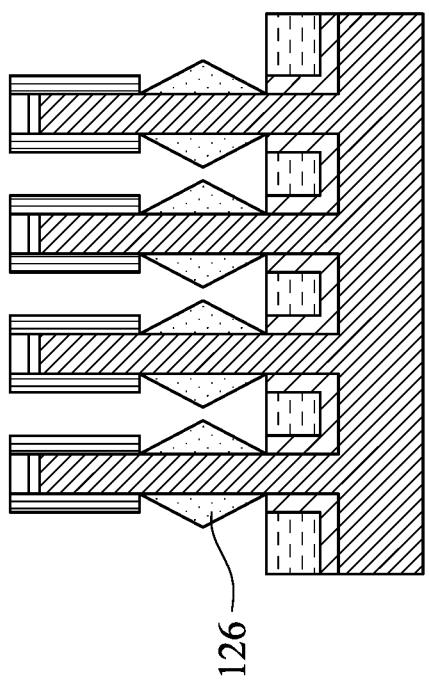
Figure 23:
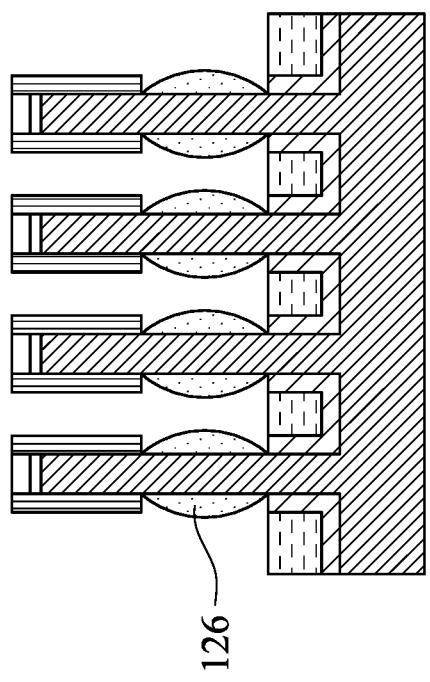

Although the epitaxy source features 126 are formed as including the facets F1, F2 and F3, as depicted in FIG. 19, the epitaxy source features 126 can be formed in other shapes. For example, FIGS. 20-25 are cross-sectional views of semiconductor devices during fabrication in accordance with some embodiments of the present disclosure, in which FIGS. 20-25 illustrate various epitaxy source features 126 with different shapes. As shown in FIG. 20, the epitaxy source features 126 are formed in diamond shapes with sloped sidewalls. As shown in FIG. 21, the epitaxy source features 126 are formed in cylinders with vertical sidewalls. As shown in FIG. 22, the epitaxy source features 126 are formed in barrels with convex sidewalls. As shown in FIG. 23, the epitaxy source features 126 are formed in diamond shapes that are similar with the shapes illustrated in FIG. 20, in which the epitaxy source features 126 are grown from the fins until the epitaxy source features 126 are merged. As shown in FIG. 24, the epitaxy source features 126 are formed in diamond shapes that are similar with the shapes illustrated in FIG. 11, in which the epitaxy source features 126 are grown from the fins until the epitaxy source features 126 are merged.

As shown in FIG. 25, operations respectively performed before FIG. 25 are as described in FIGS. 1-10, and hence they are not repeated herein. First bottom portions of fins 112a-112d under the channel regions 120a-120d are removed, and second bottom portions 113a, 113b, 113c, and 113d of the fins 112a-112d under the channel regions 120a-120d remain, such that openings 138 are formed in the second bottom portions 113a-113d of fins 112a-112d. In addition, the upper portions of the fins 112a-112d are supported by the second bottom portions 113a, 113b, 113c, and 113d of the fins 112a-112d, and the upper portions of the fins 112a-112d has first surfaces S1 and the substrate 102 has a second surface S2 facing the first surfaces S1.

During the epitaxial process of the epitaxy source feature 126, the epitaxy source feature 126 is grown in the opening 138 and between the first surface S1 and the second surface S2. That is, a first portion 126a of the epitaxy source feature 126 is epitaxially grown from the first surface S1, and a second portion 126b of the epitaxy source feature 126 is epitaxially grown from the second surface S2. In some embodiments, the first portion 126a and the second portion 126b are merged with each other. In some embodiments, there exists a distinguishable interface between the first portion 126a and the second portion 126b. In alternative embodiments, the first portion 126a and the second portion 126b may be merged with no distinguishable interface therebetween.

As described above, in the semiconductor device, since the channel regions are formed prior to the growth of the epitaxy source features, the channel regions are not susceptible to the quality of the epitaxy source features. For example, if defects such as high surface roughness of the epitaxy source features are formed, the channel regions are not susceptible to the defects of the epitaxy source features because the channel regions are formed prior to formation of these defects. Furthermore, since the channel regions are formed in advance, the surface roughness of the epitaxy source features does not affect the surface roughness of the channel regions. Therefore, surface roughness of the channel regions is less than surface roughness of the epitaxy source features. As a result, improved qualities of the channel regions can be obtained even if growth of the epitaxy source features induces defects.

According to various embodiments of the present disclosure, a device includes a semiconductor fin, a first epitaxy structure and a gate stack. The semiconductor fin protrudes from a substrate. The first epitaxy feature laterally surrounds a first portion of the semiconductor fin. The gate stack laterally surrounds a second portion of the semiconductor fin above the first portion of the semiconductor fin, wherein the second portion of the semiconductor fin has a lower surface roughness than the first epitaxy feature.

According to various embodiments of the present disclosure, a device includes a semiconductor fin, a first epitaxy structure, a gate structure and a second epitaxy structure. The semiconductor fin protrudes above a substrate. The first epitaxy structure is above the substrate. The semiconductor fin extends vertically through the first epitaxy structure. The gate structure is above the first epitaxy structure. The semiconductor fin further extends vertically through the gate structure. The second epitaxy structure is above the gate structure and caps a top surface of the semiconductor fin.

According to various embodiments of the present disclosure, a device includes a plurality of semiconductor fins and a multi-layer isolation region. The plurality of semiconductor fins are on an upper surface of a semiconductor substrate. The plurality of semiconductor fins are spaced apart from one another. The multi-layer isolation region is in between the semiconductor fins. The multi-layer isolation region includes an oxide layer and a protective layer on an upper surface of the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a plurality of semiconductor fins extending from a substrate;
   a plurality of first source/drain regions epitaxially grown from first regions of the plurality of semiconductor fins, wherein adjacent two of the plurality of first source/drain regions grown from adjacent two of the plurality of semiconductor fins are spaced apart by an isolation dielectric, wherein the plurality of semiconductor fins has a surface roughness less than a surface roughness of the plurality of first source/drain regions;
   a gate structure laterally surrounding second regions of the plurality of semiconductor fins, wherein the second regions are above the first regions of the plurality of semiconductor fins; and
   a plurality of second source/drain regions over third regions of the plurality of semiconductor fins, wherein the third regions are above the second regions of the plurality of semiconductor fins.

2. The device of claim 1, wherein one of the plurality of first source/drain regions has a height greater than a height of the gate structure.

3. The device of claim 1, wherein one of the plurality of first source/drain regions has a height greater than a height of one of the plurality of second source/drain regions.

4. The device of claim 1, wherein the gate structure is over the isolation dielectric, wherein the isolation dielectric spaces apart the adjacent two of the plurality of semiconductor fins.

5. The device of claim 1, further comprising a dielectric layer spacing apart the plurality of second source/drain regions.

6. The device of claim 5, wherein the dielectric layer is spaced apart from the isolation dielectric by the gate structure.

7. The device of claim 1, wherein the plurality of semiconductor fins has a surface roughness different from a surface roughness of the plurality of first source/drain regions.

8. The device of claim 1, wherein the plurality of first source/drain regions are sources regions, and the plurality of second source/drain regions are drain regions.

9. The device of claim 1, wherein one of the plurality of second source/drain regions interfaces a top surface of one of the plurality of semiconductor fins.

10. A device, comprising:
    a fin structure over a substrate;
    a top epitaxial region on a top segment of the fin structure;
    a transistor gate around the fin structure and below the top epitaxial region; and
    a bottom epitaxial region on the fin structure, the bottom epitaxial region being below the transistor gate, the bottom epitaxial region having:
    a first profile having a first facet and a second facet opposing the first facet, wherein a width between the first facet and the second facet varies in a vertical direction;
    a second profile over the first profile, the second profile having a third facet and a fourth facet opposing the third facet, wherein a width between the third facet and the fourth facet is more constant than the width between the first facet and the second facet in the vertical direction; and
    a third profile over the second profile, the third profile having a fifth facet and a sixth facet opposing the fifth facet, wherein the width between the third facet and the fourth facet is more constant than a width between the fifth facet and the sixth facet in the vertical direction, wherein the first facet, the second facet, the third facet, the fourth facet, the fifth facet or the sixth facet of the bottom epitaxial region has a surface roughness greater than a surface roughness of the fin structure.

11. The device of claim 10, wherein the width between the first facet and the second facet of the first profile of the bottom epitaxial region increases as a distance from the substrate increases.

12. The device of claim 10, wherein the width between the fifth facet and the sixth facet of the third profile of the bottom epitaxial region decreases as a distance from the substrate increases.

13. The device of claim 10, wherein the third facet and the fourth facet of the second profile of the bottom epitaxial region are vertical facets.

14. The device of claim 10, wherein the top epitaxial region has a cross-sectional profile different than the bottom epitaxial region.

15. A device, comprising:
    a first fin and a second fin on a substrate;

a first epitaxial region around the first fin, the first epitaxial region having a surface roughness different than a surface roughness of a channel region of the first fin, wherein the first epitaxial region has the surface roughness greater than the surface roughness of the channel region of the first fin;

a second epitaxial region around the second fin, the second epitaxial region having a surface roughness different than a surface roughness of a channel region of the second fin; and a gate around the channel region of the first fin and the channel region of the second fin.

16. The device of claim 15, wherein the second epitaxial region has the surface roughness greater than the surface roughness of the channel region of the second fin.

17. The device of claim 15, wherein the first epitaxial region has a vertical sidewall facing away from the second epitaxial region.

18. The device of claim 15, wherein the first epitaxial region has an angled corner farthest from the second epitaxial region.

19. The device of claim 15, wherein the first epitaxial region comprises a pair of downward-facing facets, a pair of vertical facets over the pair of downward-facing facets, and a pair of upward-facing facets over the pair of vertical facets.

20. The device of claim 15, wherein the first epitaxial region is a doped region.

* * * * *